United States Patent
Mrzel et al.

(10) Patent No.: US 8,007,756 B2
(45) Date of Patent: Aug. 30, 2011

(54) PROCESS FOR THE SYNTHESIS OF NANOTUBES AND FULLERENE-LIKE NANOSTRUCTURES OF TRANSITION METAL DICHALCOGENIDES, QUASI ONE-DIMENSIONAL STRUCTURES OF TRANSITION METALS AND OXIDES OF TRANSITION METALS

(75) Inventors: Ales Mrzel, Ljubljana (SI); Maja Remskar, Grosuplje (SI); Adolf Jesih, Planina (SI); Marko Virsek, Grosuplje (SI)

(73) Assignee: Institut "Jožef Stefan", Ljubljana (SI)

( * ) Notice: Subject to any disclaimer, the term of this patent is extended or adjusted under 35 U.S.C. 154(b) by 0 days.

(21) Appl. No.: 12/593,522

(22) PCT Filed: Mar. 28, 2008

(86) PCT No.: PCT/SI2008/000023
§ 371 (c)(1),
(2), (4) Date: Dec. 17, 2009

(87) PCT Pub. No.: WO2008/121081
PCT Pub. Date: Oct. 9, 2008

(65) Prior Publication Data
US 2010/0129285 A1 May 27, 2010

(30) Foreign Application Priority Data

Mar. 30, 2007 (SI) ................. P-200700081
Sep. 25, 2007 (SI) ................. P-200700233

(51) Int. Cl.
*C01B 17/00* (2006.01)
*C01B 19/00* (2006.01)

(52) U.S. Cl. ..... 423/508; 423/509; 423/511; 423/561.1; 977/734

(58) Field of Classification Search .............. 423/508, 423/509, 511, 561.1; 977/734
See application file for complete search history.

(56) References Cited

U.S. PATENT DOCUMENTS

| | | | |
|---|---|---|---|
| 2004/0018306 A1 | 1/2004 | Tenne et al. | |
| 2004/0089410 A1* | 5/2004 | Tenne et al. | 156/230 |

(Continued)

FOREIGN PATENT DOCUMENTS

EP 154528 A1 9/1985

(Continued)

OTHER PUBLICATIONS

International Search Report mailed on Nov. 20, 2008 in PCT/SI2008/000023.

(Continued)

*Primary Examiner* — Timothy Vanoy
(74) *Attorney, Agent, or Firm* — Smith Moore Leatherwood LLP (57) ABSTRACT

The object of the invention is a process for the synthesis of nanotubes of transition metal dichalcogenides, of fullerene-like nanostructures of transition metal dichalcogenides, of nanotubes of transition metal dichalcogenides, filled with fullerene-like nanostructures of transition metal dichalcogenides, of quasi one-dimensional structures (nanowires, microwires and ribbons) of transition metal oxides and of quasi one-dimensional structures of transition metal dichalcogenides, consisting of fine crystallites of transition metal dichalcogenides. The process is characterized in that the synthesis occurs by the chemical transformation of quasi one-dimensional compounds with a sub-micron diameter, described by the formula $M_6C_yH_z$, $8.2 < y+z \leq 10$, where M is a transition metal (Mo, W, Ta, Nb), C is a chalcogen (S, Se, Te), H is a halogen (I).

32 Claims, 8 Drawing Sheets

U.S. PATENT DOCUMENTS

2006/0071165 A1* 4/2006 Tenne et al. .................. 250/309
2007/0274895 A1* 11/2007 Jesih et al. .................. 423/462

FOREIGN PATENT DOCUMENTS

WO 0230814 A1 4/2002
WO 2008121081 A2 10/2008

OTHER PUBLICATIONS

Dragan Milhailovic et al., "The Synthesis, Structure and Properties of Single-Wall Molybdenum Disulphide Nanotubes," copyright 2001, AIP Conference Proceedings, American Institute of Physics, No. 591, pp. 478-482, New York, NY, US.

R. Nitsche, "The growth of single crystals of binary and ternary chalcogenides by chemical transport reactions," copyright 1960, Journal of Physics and Chemistry of Solids, vol. 17, No. 1-2, pp. 163-165, Pergamon Press, London, GB.

Maja Remskar et al., "High temperature fibres composed of transition metal inorganic nanotubes," copyright 2004, Current Opinion in Solid State and Materials Science, vol. 8, pp. 121-125.

Maja Remskar et al., "Inorganic Nanotubes as Nanoreactors: The First $MoS_2$ Nanopods," copyright 2007, Adv. Mater., vol. 19, pp. 4276-4278.

Maja Remskar et al., "Self-Assembly of Subnanometer-Diameter Single-Wall $MoS_2$ Nanotubes," copyright 2001, Science, American Association for the Advancement of Science, vol. 292, pp. 479-481, Washington, DC, US.

Maja Remskar et al., "$WS_2$ Nanobuds as a New Hybrid Nonmaterial," copyright 2008, American Chemical Society, Nano letters, vol. 8, No. 1, pp. 76-80.

U.S. Appl. No. 12/528,162, filed Aug. 21, 2009, Remskar et al.

Daniel Vrbanic et al., "Air-stable monodispersed $Mo_6S_3I_6$ nanowires," copyright 2004, Nanotechnology, Institute of Physics Publishing, vol. 15, pp. 635-638, Great Britain.

Written Opinion mailed on Nov. 20, 2008 in PCT/SI2008I000023.

Yan-Hui Li et al., "Novel Route to $WO_x$ Nanorods and $WS_2$ Nanotubes from $WS_2$ Inorganic Fullerenes," copyright 2006, American Chemical Society, J. Phys. Chem., vol. 110, pp. 18191-18195.

* cited by examiner

PROCESS FOR THE SYNTHESIS OF NANOTUBES AND FULLERENE-LIKE NANOSTRUCTURES OF TRANSITION METAL DICHALCOGENIDES, QUASI ONE-DIMENSIONAL STRUCTURES OF TRANSITION METALS AND OXIDES OF TRANSITION METALS

This application is a national stage application under 35 U.S.C §371 of international application No. PCT/SI2008/000023 filed 28 Mar. 2008, and claims priority to Slovenian Application Nos. P-200700081 filed 30 Mar. 2007 and P200700233 filed 25 Sep. 2007, the disclosures of which are expressly incorporated herein by reference.

OBJECT AND TECHNICAL FIELD OF INVENTION

The object of the invention is a process for the synthesis of nanotubes of transition metal dichalcogenides, of fullerene-like nanostructures of transition metal dichalcogenides, of nanotubes of transition metal dichalcogenides, filled with fullerene-like nanostructures of transition metal dichalcogenides, of quasi one-dimensional structures (nanowires, microwires and ribbons) of transition metal oxides and of quasi one-dimensional structures of transition metal dichalcogenides, consisting of fine crystallites of transition metal dichalcogenides. The invention is in the field of inorganic chemistry and of chemistry of transition metal dichalcogenides. The invention relates to the synthesis of nanotubes of transition metal dichalcogenides, of fullerene-like nanostructures of transition metal dichalcogenides, of nanotubes of transition metal dichalcogenides, filled with fullerene-like nanostructures of transition metal dichalcogenides, of quasi one-dimensional structures (nanowires, microwires and ribbons) of transition metal oxides, and of quasi one-dimensional structures of transition metal dichalcogenides, consisting of fine crystallites of transition metal dichalcogenides, using the method of transformation of quasi one-dimensional compounds with a sub-micron diameter, described by the formula $M_6C_yH_z$, $8.2<y+z\leq10$, where M is a transition metal (Mo, W, Ta, Nb), C is a chalcogen (S, Se, Te); H is a halogen (I), by heating in the presence of at least one reactive reagent containing a chalcogen, directly or through previous heating in the presence of oxygen, and by the subsequent transformation of quasi one-dimensional metal oxides of transition metals formed by heating in the presence of at least one reactive reagent containing a chalcogen. This process enables the synthesis of nanotubes of transition metal dichalcogenides, of fullerene-like nanostructures of transition metal dichalcogenides, of nanotubes of transition metal dichalcogenides, filled with fullerene-like nanostructures of transition metal dichalcogenides, of quasi one-dimensional structures of metal oxides of transition metals, and of quasi one-dimensional structures of transition metal dichalcogenides, consisting of fine crystallites of transition metal dichalcogenides.

TECHNICAL PROBLEM

Inorganic fullerene-like nanostructures and inorganic nanotubes are interesting owing to special crystallographic morphology and physical characteristics. Under certain conditions they can be synthesized from many inorganic materials, including transition metal dichalcogenides, among which numerous have also a technological use. Thus, for instance $MoS_2$, one of transition metal dichalcogenides is used in catalysis, at desulphurization of oil. In addition, it is classified into the group of solid lubricants, which are used in vacuum technology and space technology and other applications where the use of liquids is limited. The oxides of transition metals are used among others as sensors of different gases, catalyst carriers and as catalysts and cathode material in batteries. For the use in catalysis and elsewhere, when the small size of particles and large active surface is important, a configuration of transition metal dichalcogenides would be desirable, where the $MoS_2$ particles with the large active surface would be simultaneously interlinked into structures, enabling simple removing of them from the liquid. Equally, a morphology of transition metal oxides with a length of a few millimeters would be useful, but it is very difficult to synthesize them with the synthesis techniques existing so far.

Several different techniques and routes are known for the synthesis of quasi one-dimensional structures (nanowires, microwires, and ribbons) of transition metal dichalcogenides, consisting of crystallites of transition metal dichalcogenides, of quasi one-dimensional structures of metal oxides of transition metals, of nanotubes of transition metal dichalcogenides, and of nanostructures of transition metal dichalcogenides with a fullerene-like shape, however until now no process has been described for the synthesis of macroscopic quantities of quasi one-dimensional structures of transition metal dichalcogenides, of metal oxides of transition metals, of nanotubes of transition metal dichalcogenides, and of nanostructures of transition metal dichalcogenides with a fullerene-like shape, using the chemical transformation of quasi one-dimensional materials, consisting of nanowires with the diameter of under one micrometer, described by the formula $M_6C_yH_z$, $8.2<y+z\leq10$, where M is a transition metal (Mo, W, Ta, Nb), C is a chalcogen (S, Se, Te); H is a halogen (I).

A technical problem is a simple synthesis of macroscopic quantities of long nanotubes of transition metal dichalcogenides, of nanostructures of transition metal dichalcogenides with a fullerene-like shape, of nanotubes of transition metal dichalcogenides, filled with nanostructures of transition metal dichalcogenides with a fullerene-like shape, and a process for the synthesis of macroscopic quantities of quasi one-dimensional structures of transition metal dichalcogenides, and of metal oxides of transition metals, using the chemical transformation of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te); H is a halogen (I).

STATE OF THE ART

Several various techniques and synthesis routes are known for the synthesis of nanotubes of transition metal dichalcogenides, and of nanostructures of transition metal dichalcogenides with a fullerene-like shape. By means of irradiation of powdery particles of $MoS_2$ layer crystals with electrons and by using laser evaporation, fullerene-like $MoS_2$ nanoparticles can be obtained. These fullerene-like nanostructures have a closed spherical structure of sulphide layers—described in Jose-Yacaman, M.; Lorez, H.; Santiago, P.; Galvan, D. H.; Garzon, I. L.; Reyes, A. Appl. Phys. Lett. 1996, 69, 8, 1065; Parilla, P. A.; Dillon, A. C.; Jones, K. M.; Rider, G.; Schulz, D. L.; Ginley, D. S.; Heben, M. J. Nature 1999, 397, 114. By irradiating $MoS_3$ nanoparticles with short electric pulses, $MoS_3$ nanoparticles are obtained, which are surrounded by some $MoS_2$ layers with closed structures—described in Homyonfer, M.; Mastai, Y.; Hershfinkel, M.; Volterra, V.; Hutchison, J. L.; Tenne, R. J. Am. Chem. Soc. 1996, 118, 33, 7804. Inorganic fullerene-like nanostructures and $MoS_2$ nanotubes can be also synthesized with chemical methods. The first syntheses of fullerene-like $MS_2$ nanostructures (M=Mo, W) were based on sulphurization of an amorphous $MO_3$ thin film (M=Mo, W) in reductive atmosphere at elevated temperatures (about 850° C.)—described in Tenne, R.; Margulis, L.; Genut, M.; Hodes, G. Nature 1992, 360, 444; Margulis, L.; Salitra, G.; Tenne, R.; Talianker, M. Nature 1993, 365, 113; Hershfinlkel, M.; Gheber, L. A.; Volterra, V.; Hutchison, J. L.; Margulis, L.; Tenne, R. J. Am. Chem. Soc. 1994, 116, 1914. The synthesis of fullerene-like $MoS_2$ nanostructures, including $MoS_2$ nanotubes, can be performed from molybdenum oxide powder instead on a precursor thin film. The synthesis, however, is suitable only for small quantities of the material at highly limited control of the size of nanoparticles formed—described in Feldman, Y.; Wasserman, E.; Srolovitz, D. J.; Tenne, R. Science 1995, 267, 222. Macroscopic quantities of fullerene-like $WS_2$ nanostructures and $WS_2$ nanotubes were synthesized from the powder of tungsten oxide nanoparticles—described in Feldman, Y.; Frey, G. L.; Homyonfer, M.; Lyakhovitskaya, V.; Margulis, L.; Cohen, H.; Hodes, G.; Hutchison, J. L.; Tenne, R. J. Am. Chem. Soc. 1996, 118, 5362; Rothschild, A.; Frey, G. L.; Homyonfer, M.; Tenne, R.; Rappaport, M. Mat. Res. Innovat. 1999, 3, 145. The synthesis is efficiently carried out only with more reactive oxides (e.g., $WO_3$) in the temperature range from 700° C. to 850° C., in which closed spherical structures of sulphide layers are obtained. The first sulphide layer inhibits the association of oxide nanoparticles into aggregates, and enables the growth of further concentric sulphide layers, typical of fullerene structures. The size and shape of fullerene-like particles is determined by initial oxide nanoparticles smaller than 300 nm, with larger particles layer crystals are obtained. Using special equipment at certain temperature conditions, a nearly pure phase of fullerene-like nanoparticles can be obtained. The method is not applicable to the synthesis of less reactive oxides, such as titanium and niobium oxide—described in Tenne, R.; Feldman, Y.; Zak, A.; Rosentsveig, R.; United States Patent Application 20040018306. Molybdenum and tungsten sulphide and selenide fullerene-like structures were prepared with the use of high energy methods enabling high activation energies in very short time, such as irradiation with electrons—described in Stephan, O.; Bando, Y.; Loiseau, A.; Willaime, F.; Shramchenko, N.; Tamiya, T.; Sato, T. Appl. Phys. A—Mat. Sci. Proc. 67, 1, 107-111, 1998, laser evaporation—described in Sen, R.; Govindaraj, A.; Suenaga, K.; Suzuki, S.; Kataura, H.; Iijima, S.; Achiba, Y. Chem. Phys. Lett. 340, 3-4, 242-248, 2001, microwave plasma—described in Vollath, D.; Szabo, D. V.; Act. Mat. 48 (4), 953-967, 2000, electric arc—described in Sano, N.; Wang, H. L.; Chowalla, M.; Alexandrou, I.; Amaratunga, G. A. J.; Naito, M.; Kanki, T.; Chem. Phys. Lett. 368, 3-4, 331-337, 2003.

In a reaction between $NbCl_5$ and $H_2S$ at an elevated temperature, hollow $NbS_2$ fullerenes are formed—described in Schuffenhauer, C.; Popovitz-Biro, R.; Tenne, R. Jour. Mat. Chem. 12, 5, 1587-1591, 2002. Fullerene-like $MoS_2$ ($MoSe_2$) structures were also efficiently synthesized in the reaction of a suitable metal halide with a sulphur reagent—described in Parilla, P. A.; Dillon, A. C.; Jones, K. M.; Riker, G.; Schulz, D. L.; Ginley, D. S.; Heben, M. J. Nature 397, 6715, 114, 1999; $TiS_2$—described in Margolin, A.; Popovitz-Biro, R.; Albu-Yaron, A.; Moshkovich, A.; Rapoport, L.; Tenne, R. Curr. NanoScience 1, 3, 253-262, 2005. $ReS_2$ fullerene-like nanoparticles are formed by the sulphurization of $ReO_2$, which is formed by $ReO_3$ decomposition—described in Coleman, K. S.; Sloan, J.; Hanson, N. A.; Brown, G.; Clancy, G. P.; Terrones, M.; Terrones, H.; Green, M. L. H.; Jour. Amer. Chem. Soc. 124 (39), 11580-11581, 2002.

The first inorganic nanotubes of transition metal chalcogenides were synthesized with the method of sulphurization of metal oxides—described in Tenne, R.; Rothschild, A.; Homyonfer, M.; United States Patent Base, U.S. Pat. No. 6,217,843 (Appl. No. 308663). The material prepared in such a manner is composed of nanotubes of different diameter and wall thickness and contains many other admixtures. $MoS_2$ and $WS_2$ nanotubes can also be synthesized using a chemical transport reaction of $MS_2$ powder (M=W, Mo) with iodine or bromine as transport reagents—described in Remskar, M.; Skraba, Z.; Cleton, F.; Sanjines, R.; Levy, F. Appl. Phys Lett. 1996, 69, 351; Remskar, M.; Skraba, Z.; Regula, M.; Ballif, C.; Sanjines, P.; Levy, F. Adv. Mater. 1998, 10, 246. The synthesis of nanotubes is also possible with the use of water solution of ammonium thiomolybdate, in which a porous aluminium membrane is soaked. This is followed by heating, which leads to the formation of $MoS_2$ nanotubes, that are isolated by dissolving the membrane with KOH—described in Zelenski, C. M.; Dorhout, P. K. J. Am. Chem. Soc. 1998, 120, 734. By means of a modified transport reaction, which is catalyzed by $C_{60}$, pure, ordered, monolayer tubular $MoS_2$ structures are obtained—described in Remskar, M.; Mrzel, A.; Skraba, Z.; Jesih, A.; Ceh, M.; Demsar, J.; Sadelmann, P.; Levy, F.; Mihailovic, D. Science, 292, 479, 2001; Remskar, M.; Mrzel, A.; Skraba, Z.; Mihailovic, D. D.; Musevic, I.; International Application No.: PCT/SI2001/000027, with the same diameter of under 1 nm, growing in the form of bundles. For a synthesis of this material a transport reaction is needed, which is relatively demanding and is unsuitable for a synthesis of large quantities of nanotubes. By means of a rapid thermolysis of ammonium molybdate molybdenum oxides were obtained having a spherical and rod-like form, which were transformed with $H_2S$ to fullerene-like $MoS_2$ nanostructures and $MoS_2$ nanotubes—described in Therese, H. A.; Zink, N.; Kolb, U.; Tremel, W.; Sol. Stat. Sci. 8 (10): 1133-1137, 2006.

Until now it has not been reported on the synthesis and morphology of transition metal dichalcogenides, in which nanotubes of transition metal dichalcogenides are filled with nanostructures of transition metal dichalcogenides with a fullerene-like shape. Likewise, no report has been made on the process for the synthesis of macroscopic quantities of nanotubes of transition metal dichalcogenides, of nanostructures of transition metal dichalcogenides with a fullerene-like shape, and of nanotubes of transition metal dichalcogenides, filled with nanostructures of transition metal dichalcogenides with a fullerene-like shape, obtained by chemical transformation of quasi one-dimensional materials, described by the formula $M_6C_yH_z$, $8.2<y+z \leqq 10$, where M is a transition metal (Mo, W, Ta, Nb), C is a chalcogen (S, Se, Te); H is a halogen (I).

$MoS_2$ nanostructures are potentially interesting for the use in a variety of applications from nanoelectronics, photocatalysis, nanotribology, solar cells, in enzymes and in obtaining hydrogen. The catalytic activity in hydrodesulphurization catalysis (HDS) is not only dependent on the type of edges in nanostructures and covering with sulphur, but also on the size of nanostructures. The best catalytic capabilities for HDS are expected in nanostructures having a weak interaction with a carrier (so-called type II) and having a size, where structural changes occur—described in Lauritsen, J. V.; Kibsgaard, J.; Helveg, S.; Topsoe, H.; Clausen, B. S.; Laegsgaard, E.; Besenbacher, F.; Nat. Nanotech. 58, 2, 2007.

Few different methods were used for the synthesis of nanowires and nanoribbons of transition metal dichalcogenides through precursor oxides. Precursor molecules of ammonium heptamolybdate tetrahydrate can be transformed into molybdenum trioxide having the morphology of nanoribbons and nanorods using different acids under hydrothermal conditions at 140° C. to 200° C. With the use of $H_2S/H_2$ at 600° C. the oxides can be transformed into $MoS_2$ nanorods having the morphology of oxides preserved—described in Xiong Wen Lou and Hua Chun Zeng Chem. Mater. 2002, 14, 4781-4789. By the two-step synthesis—hydrothermal-gas reaction $MoS_2$—$MoO_2$ nanostructural material was efficiently prepared, where the $MoS_2$ crystallites on the $MoO_2$ surface were mostly in the form of nanowires, ranging up to 30 nm. The measurements on nanostructures indicate an increased catalytic activity and selectivity—described in Camacho-Bragado, G. A.; Elechiguerra, J. L.; Olivas, A.; Fuentes, S.; Galvan, D.; Yacaman, M. J.; Jour. Cat. 234, 1: 182-190, 2005. Polycrystalline $MoS_2$ nano and microribbons were synthesized by the two-step electrochemical/chemical synthesis method, where the precursor $MoO_2$ nanowires were first oriented in the electric field on the surface of pyrolytic graphite. These nanowires were transformed into $MoS_2$ with $H_2S$ at 900° C. The ribbons formed had a length of up to 1 mm and were composed of $MoS_2$ crystallites having a structure similar to conventional layer crystals—described in Li, Q.; Newberg, J. T.; Walter, E. C.; Hemminger, J. C.; Penner, R. M.; Nano Lett. 4, 2, 277-281, 2004. $MoS_2$ nanorods having a diameter of about 20 nm are formed by 24 hour-hydrothermal method from water solution of $(NH_4)_6Mo_7O_{24}$ $4H_2O$, $C_2H_4NS$ and $Na_2S_2O_4$ at 190° C., whereby the product formed was thereafter heated still in nitrogen—described in Ota, J. R.; Srivastava, S. K.; Jour. NanoSci. Nanotech. 6, 1, 168-174, 2006.

$MoO_3$ nanowires with orthorhombic structure and a diameter of about 10 nm were synthesized by electrodeposition. These nanowires show higher sensitivity to ammonia than the conventional sol-gel sensors—described in Gouma, P.; Bishop, A.; Yer, K. K. Rare Met. Mat. Engin. 35, 295-298, 3, 2006. The oriented nanowires of $MoO_3$ with similar length and diameters were prepared in two-step synthesis—by the temperature evaporation and oxidation—described in Zhou, J.; Deng, S. Z.; Xu, N. S.; Chen, J.; She, J. C.; Appl. Phys. Lett. 83, 13, 2653-2655, 29, 2003. Macroscopic quantities of $MoO_3$ nanostructures with various morphologies, such as nanoflowers, nanoribbons and nanoleaves were synthesized by a chemical route with the use of $H_2O_2$ and molybdenum—described in Li, G. C.; Jing, L.; Pang, S. P.; Peng, H. R.; Zhang, Z. K. Jour. Phys. Chem. B 110, 48, 24472-24475, 7, 2006. Anisotropic crystalline nanostructures of alpha $MoO_3$ were synthesized by the decomposition and condensation of peroxymolybdenum acid under hydrothermal conditions. Nanostructures formed have a width of 200 to 300 nm, a thickness of 60 to 90 nm and a length of up to 10 micrometers—described in Fang, L.; Shu, Y. Y.; Wang, A. Q.; Zhang, T. Jour. Phys. Chem. C 111, 6, 2401-2408, 2007. Molybdenum oxide crystals were synthesized by acid decomposition of sodium molybdate under hydrothermal conditions. Under the synthesis conditions a well oriented phase can be obtained, composed of crystallites oriented along the direction, whereat the phase is even up to a few centimeters long. This material is also useful as a starting material for molybdenum chalcogenides—described in Camacho-Bragado, G. A.; Jose-Yacaman, M. Appl. Phys. A—Mat. Sci. Proc. 82, 1, 19-22, 2006.

TASK AND AIM OF THE INVENTION

The task and aim of the invention is a process for the synthesis of macroscopic quantities of nanotubes of transition metal dichalcogenides, of nanostructures of transition metal dichalcogenides with a fullerene-like shape, of nanotubes of transition metal dichalcogenides, filled with nanostructures of transition metal dichalcogenides with a fullerene-like shape, of quasi one-dimensional structures of transition metal dichalcogenides, consisting of interlinked fine crystallites of transition metal dichalcogenides, and the synthesis of quasi one-dimensional structures of metal oxides of transition metals.

According to the invention, the task is solved by a process for the synthesis of macroscopic quantities of nanotubes of transition metal dichalcogenides, of nanostructures of transition metal dichalcogenides with a fullerene-like shape, of nanotubes of transition metal dichalcogenides, filled with nanostructures of transition metal dichalcogenides, with a fullerene-like shape, of quasi one-dimensional structures of transition metal dichalcogenides, consisting of fine crystallites of transition metal dichalcogenides, and of quasi one-dimensional structures of transition metal oxides, according to independent patent claims.

These and other aspects, advantages, and salient features of the present invention will become apparent from the following description, the accompanying drawings, and the appended claims.

BRIEF DESCRIPTION FOR THE DRAWINGS

The drawings referenced herein form a part of the specification. Features shown in the drawings are meant to be illustrative of some, but not all, aspect of embodiments and/or embodiments of the present invention, unless otherwise explicitly indicated, and implications to the contrary are otherwise not to be made. Although like reference numerals correspond to similar, though not necessarily identical, components and/or features in the drawings, for the sake of brevity, reference numerals or features having a previously described function may not necessarily be described in connection with other drawings in which such components and/or features appear.

DESCRIPTION OF THE INVENTION

The invention will be described by Examples I and II of the application.

Example I of Application

Figure 1:
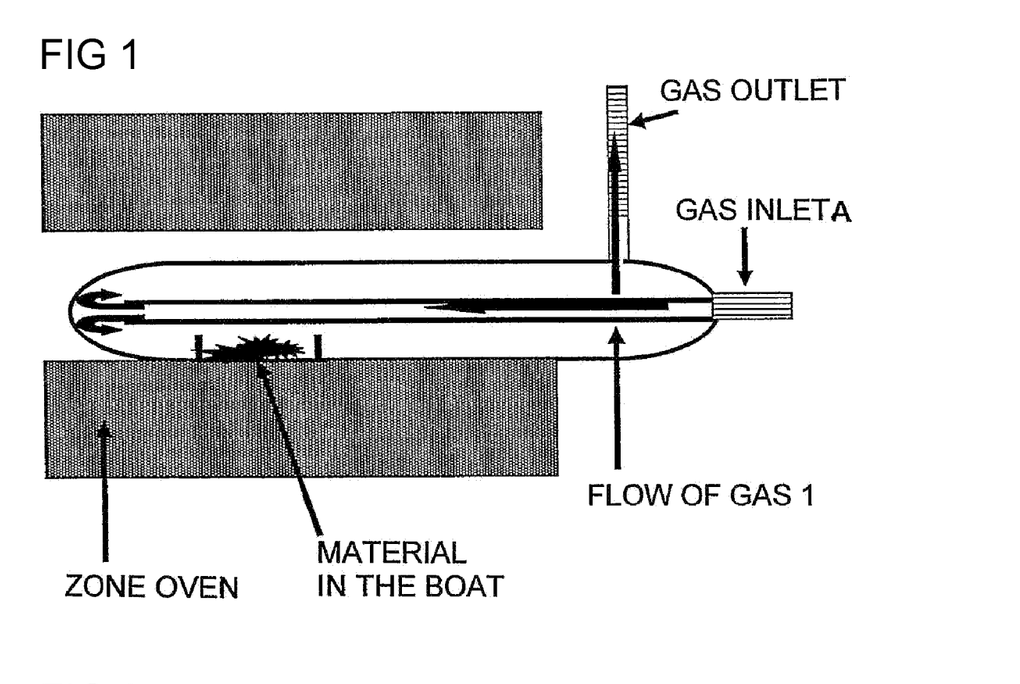
FIG. 1 is a schematic illustrating a setup used in Example I of this application to perform an experiment in a zone oven according to aspect of embodiments and/or embodiments of the present invention.
Figure 2A:
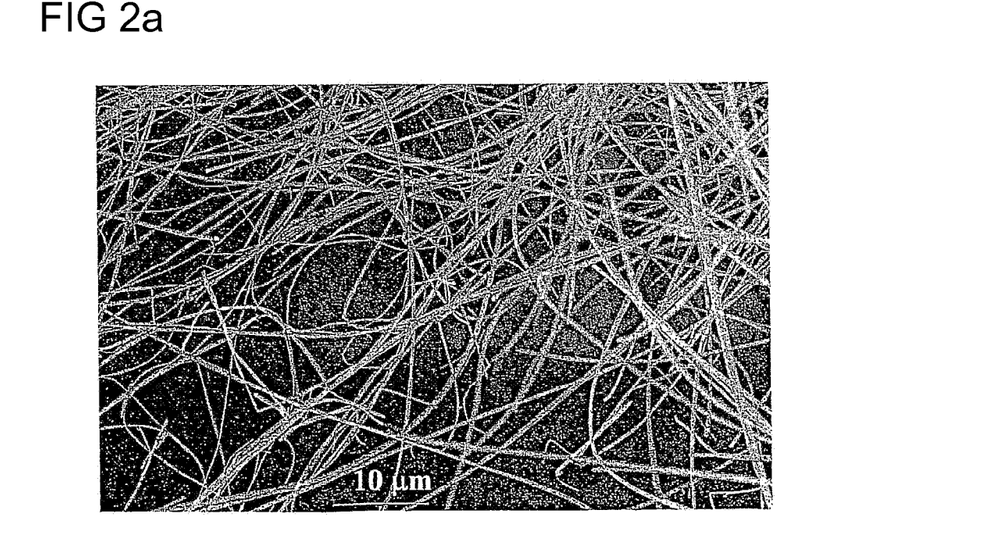
FIG. 2a is micrograph of an image, taken using a scanning electron microscope (SEM) (JEOL® JXA-840A, JEOL Ltd. Tokyo, Japan), of a $MoS_2$ material formed by sulphurization of $Mo_6S_2I_8$ nanowires in Example I of this application according to aspect of embodiments and/or embodiments of the present invention.
Figure 2B:
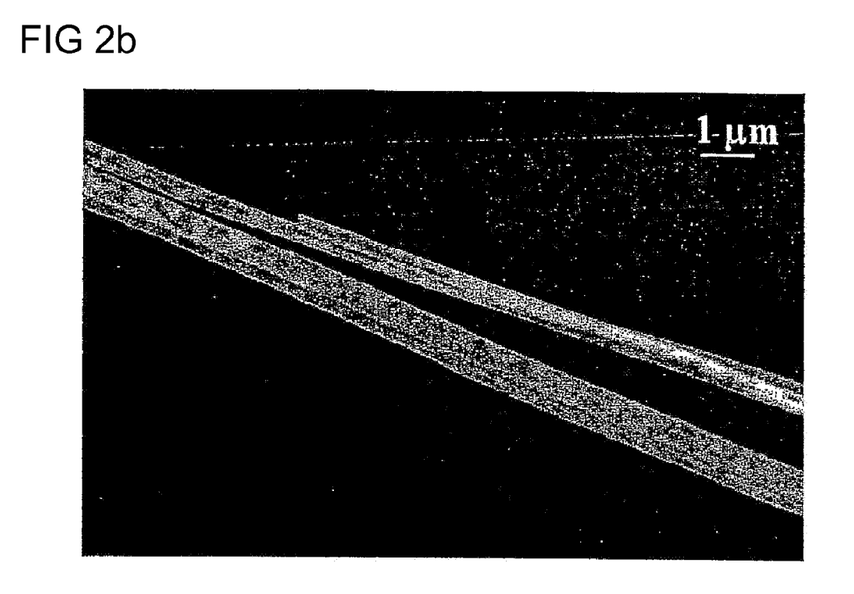
FIG. 2b is micrograph of an image, taken using a scanning electron microscope (SEM) (JEOL® JXA-840A, JEOL Ltd. Tokyo, Japan), of a $MoS_2$ material formed by sulphurization of $Mo_6S_2I_8$ nanowires in Example I of this application according to aspect of embodiments and/or embodiments of the present invention.
Figure 3A:
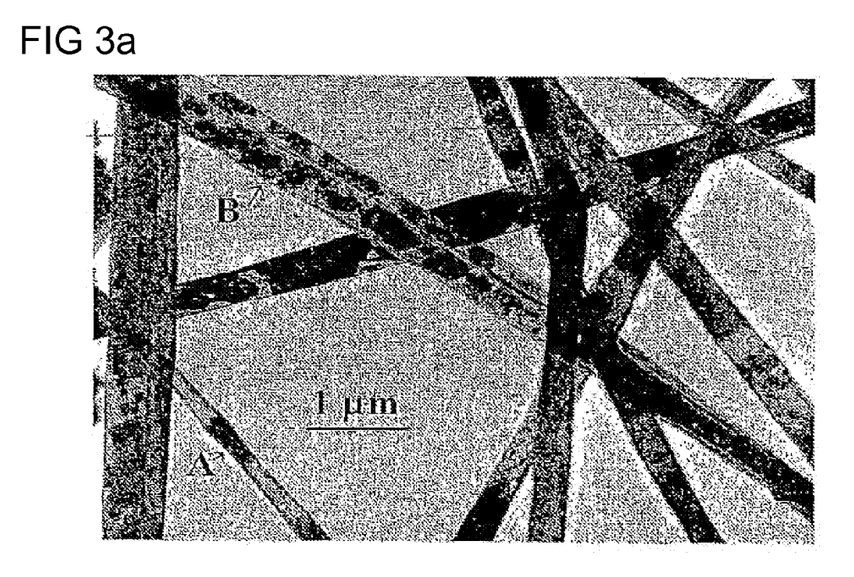
FIG. 3a is micrograph of a transmission electron microscopy (TEM) image, taken using a field emission transmission electron microscope (JEOL® 2010 F, JEOL Ltd. Tokyo, Japan), of the formed $MoS_2$ material in Example I of this application according to aspect of embodiments and/or embodiments of the present invention.
Figure 3B:
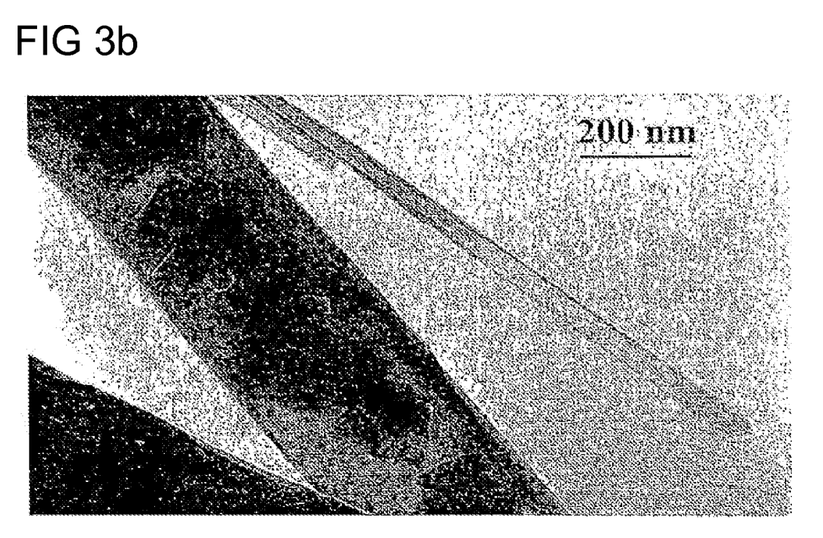
FIG. 3b is micrograph of a transmission electron microscopy (TEM) image, taken using a field emission transmission electron microscope (JEOL® 2010 F, JEOL Ltd. Tokyo, Japan), of the formed $MoS_2$ material of Example I of this application according to aspect of embodiments and/or embodiments of the present invention.
Figure 3C:
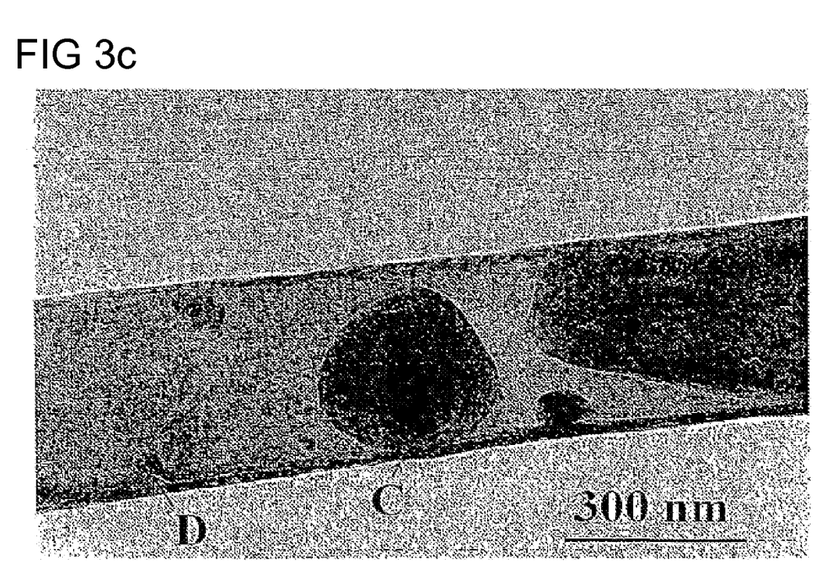
FIG. 3c is micrograph of a transmission electron microscopy (TEM) image, taken using a field emission transmission electron microscope (JEOL® 2010 F, JEOL Ltd. Tokyo, Japan), of the formed $MoS_2$ material of Example I of this application according to aspect of embodiments and/or embodiments of the present invention.
Figure 4:
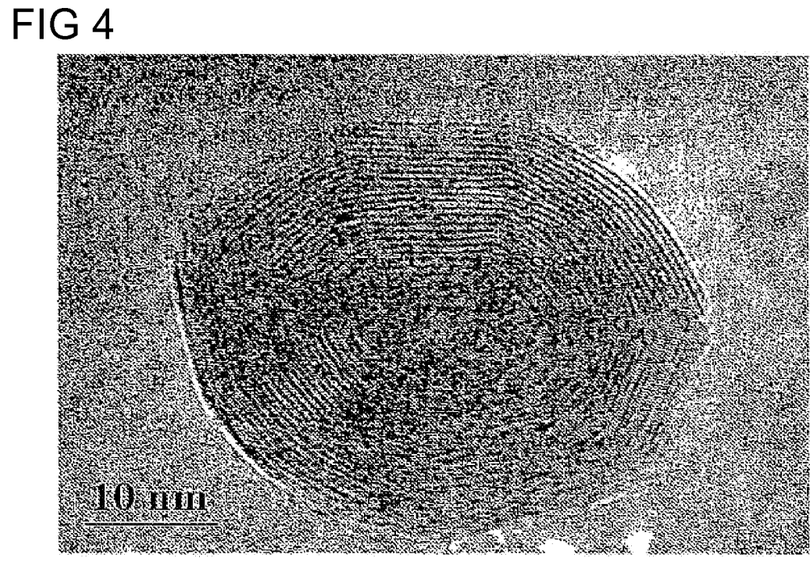
FIG. 4 is micrograph of a high resolution transmission electron microscopy (HRTEM) image, taken using a field emission transmission electron microscope (JEOL® 2010 F, JEOL Ltd. Tokyo, Japan), of fullerene-like $MoS_2$ nanostructures of Example I of this application according to aspect of embodiments and/or embodiments of the present invention.
Figure 5:
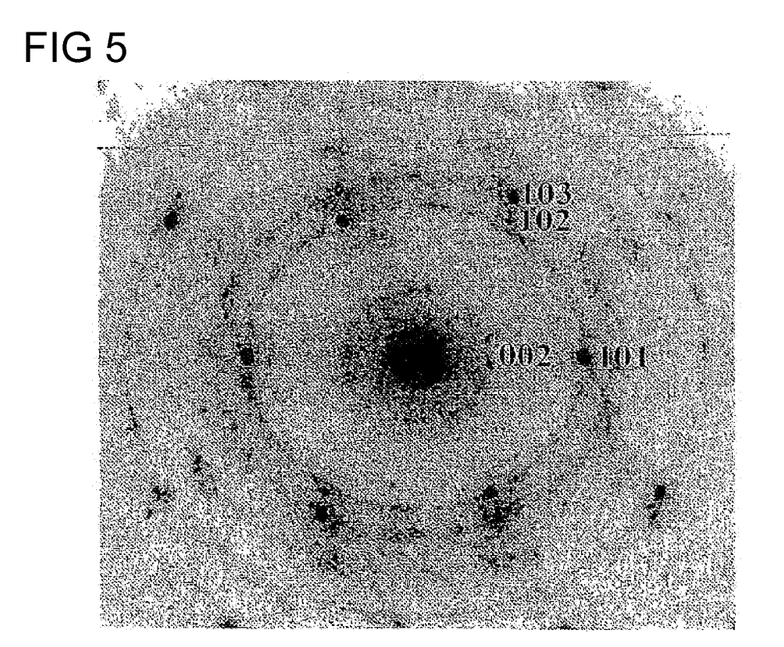
FIG. 5 is micrograph of a transmission electron diffraction (TED) image, taken using a field emission transmission electron microscope (JEOL® 2010 F, JEOL Ltd. Tokyo, Japan), on a $MoS_2$ fullerene inside a $MoS_2$ nanotube of Example I of this application according to aspect of embodiments and/or embodiments of the present invention.

Individual figures of the example of application I present:

FIG. I-1: A schematic presentation of the experiment performed in a zone oven;

FIG. I-2: FIGS. 2a, 2b) of $MoS_2$ material formed by sulphurization of $Mo_6S_2I_8$ nanowires, taken by the scanning electron microscope SEM JEOL JXA-840A;

FIG. I-3: Transmission electron microscopy (TEM) of the $MoS_2$ material formed, taken by the field emission transmission electron microscope JEOL 2010 F (FIGS. 3a, 3b, 3c);

FIG. I-4: High resolution transmission electron microscopy (HRTEM) of fullerene-like $MoS_2$ nanostructures, taken by the field emission transmission electron microscope JEOL 2010 F; and FIG. I-5: Transmission electron diffraction (TED) on a $MoS_2$ fullerene inside a $MoS_2$ nanotube, taken by the field emission transmission electron microscope JEOL 2010F.

The above described technical problem can be solved by chemical transformation of quasi one-dimensional materials, described by the formula $M_6C_yH_z$, $8.2<y+z\leq10$, where M is a transition metal (Mo, W, Ta, Nb), C is a chalcogen (S, Se, Te); H is a halogen (I). The chemical transformation (sulphurization) was carried out in a quartz tube with gas containing 98% of argon as a carrier gas, 1% of $H_2S$ and 1% of $H_2$. The reaction occurred at an elevated temperature in one-zone oven according to FIG. 1. This transformation of quasi one-dimensional ternary materials of transition metals leads to the replacement of the iodine with a chalcogen (e.g., sulphur) and the transformation into nanotubes of transition metal dichalcogenides, into nanostructures of transition metal dichalcogenides with a fullerene-like shape, and into nanotubes of transition metal dichalcogenides, filled with nanostructures of transition metal dichalcogenides with a fullerene-like shape.

The example of application of the synthesis of nanotubes of transition metal dichalcogenides, of fullerene-like nanostructures of transition metal dichalcogenides and of nanotubes of transition metal dichalcogenides, filled with fullerene-like nanostructures of transition metal dichalcogenides, is carried out by chemical transformation of quasi one-dimensional materials, described by the formula $M_6C_yH_z$, $8.2<y+z\leq10$, where M is a transition metal (Mo, W, Ta, Nb), C is a chalcogen (S, Se, Te); H is a halogen (I).

Experiments I

Into a quartz boat, 50 mg of $Mo_6S_2I_8$ nanowires were introduced, which had been synthesized directly from the elements, as described in Patent Application EP 1 541 528.

The boat with $Mo_6S_2I_8$ nanowires was placed into a quartz tube with a diameter of 34 mm, a wall thickness of 2 mm and a length of 1000 mm, closed at one end, and fitted with rough surface at the other end, enabling the closure of the tube after the introduction of the boat with the material and a simultaneous inlet of the gas into the quartz tube. The quartz tube also had a quartz outlet for the outlet of gases as shown in FIG. 1.

The closed quartz tube was first purged with argon for 15 minutes and then it was continued with blowing with Gas 1 composed of 98% of argon, 1% of $H_2S$ and 1% of $H_2$ for 10 minutes. The gas flow-rate was 40 cm$^3$ of gas per minute. The quartz tube was carefully introduced into the heated one-zone oven. The temperature of the site where the boat was placed was 837° C., as measured by a thermocouple. After two hours of blowing with Gas 1 at this temperature, the quartz tube was taken out of the zone-oven and left at room temperature for half an hour to cool down. During the whole process, blowing with Gas 1 was continued. After half an hour, when the quartz tube was cooled down, Gas 1 was turned off and the boat with the material formed was taken out of the quartz tube. The weight of the material formed was 30 mg.

Structural and Chemical Analyses

The material formed was examined with several different techniques:

1. Scanning Electron Microscopy

Scanning Electron Microscopy was performed with SEM JEOL® JXA-840A, JEOL Ltd. Tokyo, Japan. Scanning electron microscopy showed that after the sulphurization at a temperature of 837° C. the material formed preserved the form of the starting material, i.e., fibres with a length of even up to several millimeters.

2. High Resolution Transmission Electron Microscopy (HRTEM) and Diffraction (TED), taken by the 200 keV field emission transmission electron microscope JEOL 2010F.

High resolution transmission electron microscopy (HRTEM) and transmission electron diffractrography (TED) was performed using a 200 keV field emission transmission electron microscope JEOL® 2010 F, JEOL Ltd. Tokyo, Japan. Transmission electron microscopy indicated that the material was mostly composed of $MoS_2$ nanotubes, filled with $MoS_2$ fullerene structures (FIGS. 3a, 3b). The tubes are partly or completely filled with fullerene structures, consisting either of aggregates of individual fullerenes (A) or of individual flattened spheroids (B). Individual hollow nanotubes (FIG. 3b) are also present. Nanotubes are closed at the ends, walls have a variable thickness, mostly enlarged at the ends (FIG. 3b). The fullerenes show a hollow centre (FIG. 4) and a high degree of regularity of concentric spheres. $MoS_2$ fullerenes captured in the tubes have very different diameters, from a few hundred nanometers (C) to several tens nanometers (D)—(FIG. 3c). The electron diffraction on an individual fullerene (FIG. 5) shows the presence of $MoS_2$ phase only, mostly with hexagonal stacking (JCPDS-International Centre for Diffraction Data, No. 06-0097), partly also with the rhombohedral stacking (JCPDS-International Centre for Diffraction Data, No. 77-0341). Strong reflexes forming a deformed hexagonal grid, belong to the tube-envelope, and the reflexes forming the rings belong to the diffraction on the $MoS_2$ fullerene.

3. X-ray Powder Diffraction

X-ray powder patterns of specimens in glass capillary tubes with an inner diameter of 0.3 mm were taken by the Debye-Scherrer method in a camera with a diameter of 57.3 mm and CuK$_\alpha$ X-ray ($\lambda$=1.5418 Å). Positions of diffraction lines on the film were measured with the accuracy of 0.005 mm, the intensity of the lines was estimated visually.

The interplanar distances measured correspond to the interplanar distances of hexagonal and rhombohedral $MoS_2$, with the exception of five weak lines with interplanar distances of 8.762 Å, 7.476 Å, 6.837 Å, 3.244 Å and 1.705 Å. The results of X-ray powder diffraction of sulphurization products confirm the composition of $MoS_2$ with minor quantities of unidentified by-products.

TABLE 1

A comparison of interplanar distances and intensity of X-ray diffraction lines of the sulphurization product and of $MoS_2$ layer crystals

| Sulphurization Product | | $MoS_2$, 60-097 | | $MoS_2$, 77-0341 | |
| --- | --- | --- | --- | --- | --- |
| d [Å] | Intensity | d [Å] | Intensity | d [Å] | Intensity |
| 8.762 | 1 | | | | |
| 7.476 | 2 | | | | |
| 6.837 | 2 | | | | |
| 6.166 | 100 | 6.15 | 100 | 6.1366 | 100 |
| 3.244 | 1 | | | | |
| 2.987 | 2 | 3.075 | 4 | 3.0683 | 1 |
| 2.742 | 1 | 2.737 | 16 | 2.7119 | 25 |
| 2.688 | 5 | 2.674 | 10 | 2.6277 | 23 |
| 2.489 | 5 | 2.501 | 8 | | |
| 2.297 | 1 | 2.277 | 45 | | |
| 2.221 | 5 | | | 2.1990 | 33 |
| 2.045 | 5 | 2.049 | 14 | 2.0455 | 5 |
| 1.902 | 2 | | | 1.8980 | 18 |
| 1.820 | 1 | 1.83 | 25 | | |
| 1.748 | 2 | | | 1.7626 | 10 |
| 1.705 | 2 | | | | |
| 1.645 | 2 | 1.641 | 4 | | |
| 1.580 | 5 | 1.581 | 12 | 1.5830 | 14 |
| 1.533 | 3 | 1.538 | 12 | 1.5328 | 10 |
| 1.362 | 1 | 1.3688 | 2 | 1.3671 | 2 |
| 1.311 | 1 | 1.3401 | 4 | 1.3138 | 4 |
| 1.289 | 1 | 1.2983 | 6 | 1.2847 | 4 |
| 1.250 | 1 | 1.2513 | 4 | 1.2519 | 5 |

Temporal Stability and Synthesis Reproducibility

The material formed, composed of $MoS_2$ nanotubes, of fullerene-like $MoS_2$ nanostructures, and of $MoS_2$ nanotubes, filled with fullerene-like $MoS_2$ nanostructures, is stable in the air under room conditions. The stability of the compound and synthesis reproducibility were controlled by transmission electron microscopy (TEM).

The process for the synthesis of nanotubes of transition metal dichalcogenides, of fullerene-like nanostructures of transition metal dichalcogenides, and of nanotubes of transition metal dichalcogenides, filled with fullerene-like nanostructures of transition metal dichalcogenides, according to the present invention, is therefore characterized in that the synthesis occurs by means of chemical transformation of quasi one-dimensional materials, described by the formula $M_6C_yH_z$, $8.2<y+z\leq10$, where M is a transition metal (Mo, W, Ta, Nb), C is a chalcogen (S, Se, Te), H is a halogen (I). The chemical transformation of quasi one-dimensional materials, described by the formula $M_6C_yH_z$, $8.2<y+z\leq10$, where M is a transition metal (Mo, W, Ta, Nb), C is a chalcogen (S, Se, Te), H is a halogen (I), is carried out in the presence of at least one reactive reagent, containing a chalcogen. The chemical transformation of quasi one-dimensional materials, described by the formula $M_6C_yH_z$, $8.2<y+z\leq10$, where M is a transition metal (Mo, W, Ta, Nb), C is a chalcogen (S, Se, Te), H is a halogen (I), is carried out under conditions, in which the reactive reagent, containing a chalcogen, is present in vapor phase. The morphology of the material of transition metal dichalcogenides, obtained by the process according to this invention, is characterized in that the fullerene-like nanostructures of transition metal dichalcogenides are inside nanotubes of transition metal dichalcogenides.

Example II of Application

Figure 6:
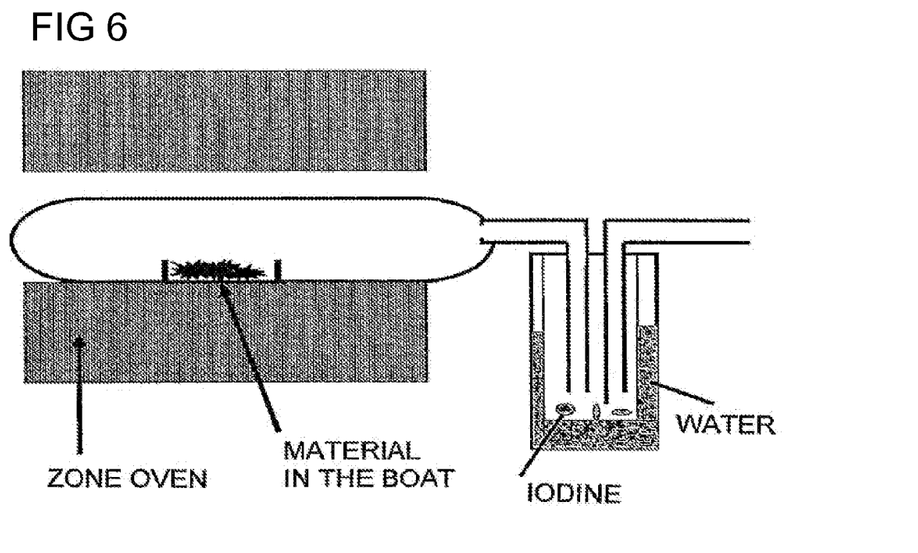
FIG. 6 is a schematic illustrating a setup used in Example II of this application to transform a quasi one-dimensional materials, consisting of nanowires with a diameter of under one micrometer, described by the formula $M_6C_3H_6$, into quasi one-dimensional molybdenum oxides, performed by heating in the air in a zone oven according to aspect of embodiments and/or embodiments of the present invention.

Individual figures of Example II of this application present:

FIG. II-1: A schematic presentation of the experiment of the transformation of quasi one-dimensional materials, consisting of nanowires with a diameter of under one micrometer, described by the formula $M_6C_3H_6$, into quasi one-dimensional molybdenum oxides, performed by heating in the air in a zone oven.

Figure 7:
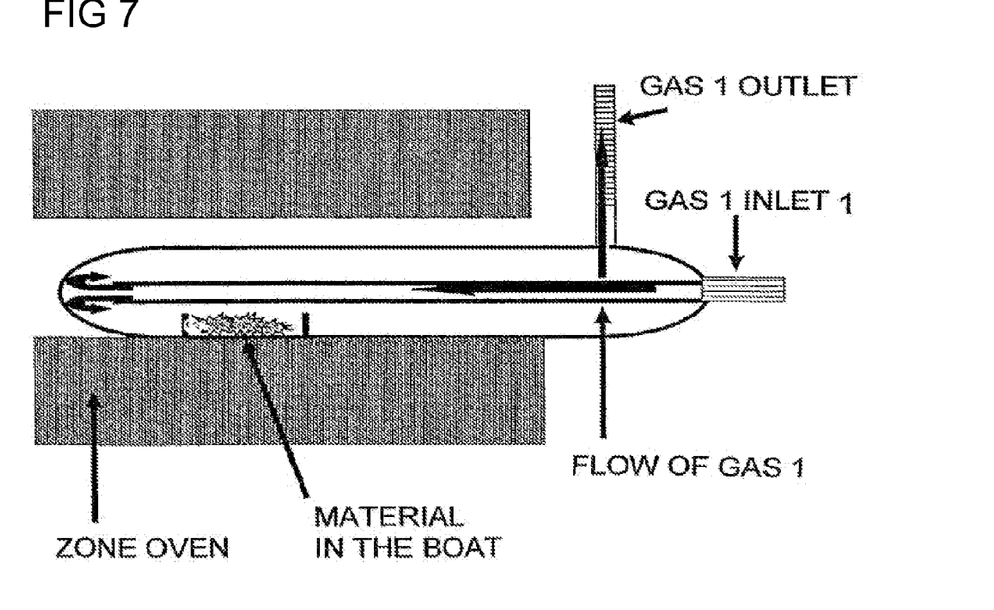
FIG. 7 is a schematic illustrating a setup used in Example II of this application to perform an sulphurization, using a the Gas 1 composed of argon/$H_2S$/$H_2$, of quasi one-dimensional structures of molybdenum oxides in a zone oven.

FIG. II-2: A schematic presentation of the experiment of sulphurization of quasi one-dimensional structures of molybdenum oxides, performed in a zone oven with the gas 1 composed of argon/$H_2S$/$H_2$.

Figure 8:
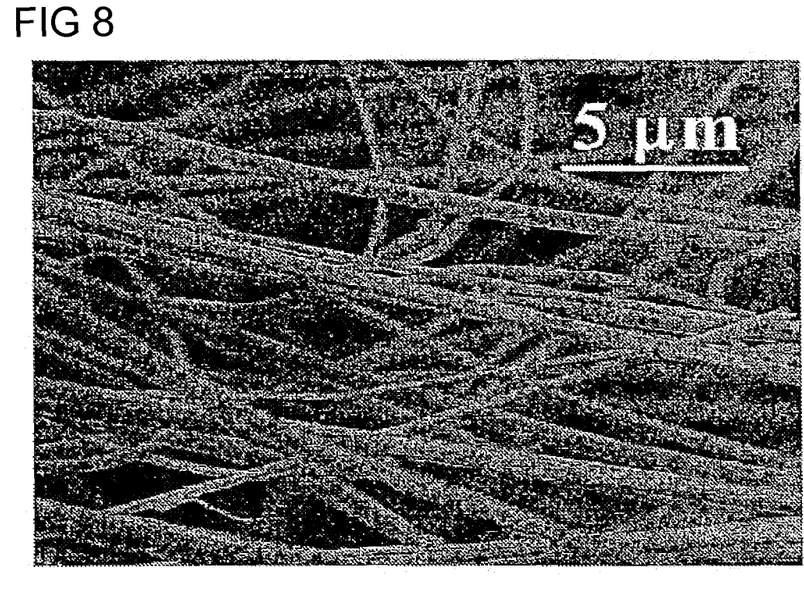
FIG. 8 is micrograph of an image, taken using a field emission scanning electron microscope FE-SEM (SUPRA® 35 VP, Carl Zeiss SMT AG, Oberkochen, Germany), of quasi one-dimensional structures of transition metal oxides formed in Example II of this application according to aspect of embodiments and/or embodiments of the present invention.

FIG. II-3: The image of quasi one-dimensional structures of transition metal oxides formed, taken by the field emission scanning electron microscope FE-SEM, Supra 35 VP, Carl Zeiss.

Figure 9:
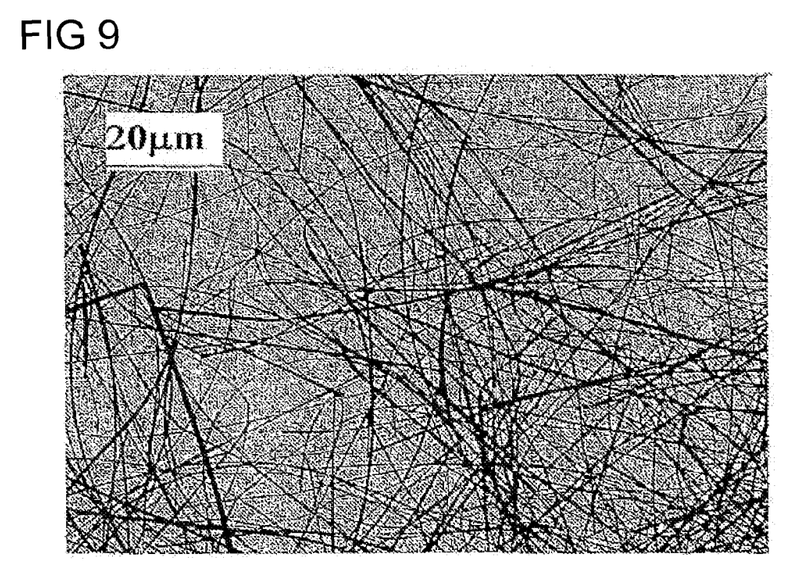
FIG. 9 is a micrograph of a transmission electron microscopy (TEM) image, taken using a field emission transmission electron microscope (JEOL® 2010 F, JEOL Ltd. Tokyo, Japan), of quasi one-dimensional structures of transition metal oxides formed in Example II of this application according to aspect of embodiments and/or embodiments of the present invention.

FIG. II-4: The image of quasi one-dimensional structures of transition metal oxides formed, taken by the field emission transmission electron microscope JEOL 2010F.

Figure 10:
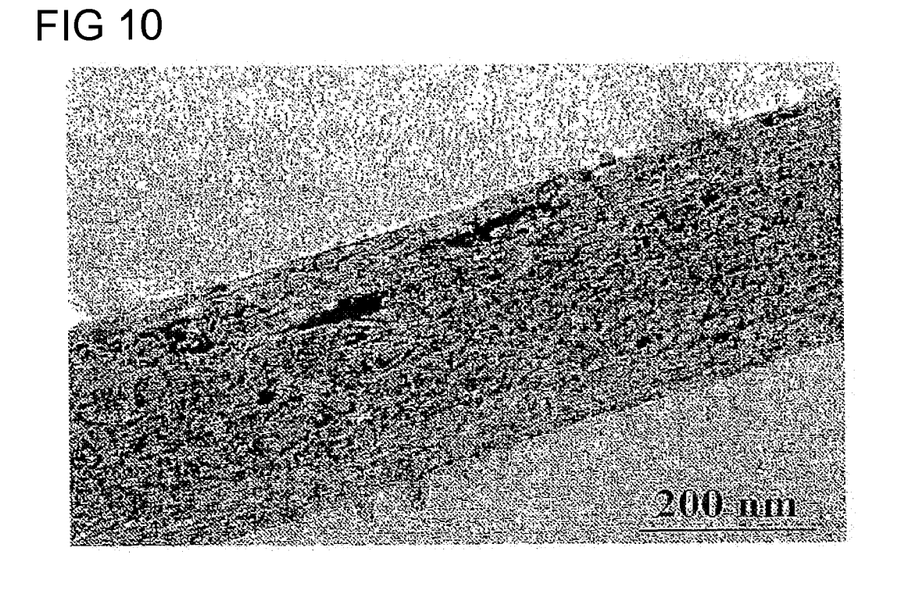
FIG. 10 is a micrograph of a transmission electron microscopy (TEM) image, taken using a field emission transmission electron microscope (JEOL® 2010 F, JEOL Ltd. Tokyo, Japan), of one nanowire of transition metal oxides formed in Example II of this application showing a polycrystalline structure and fine crystallites, growing perpendicularly to the direction of a fiber according to aspect of embodiments and/or embodiments of the present invention.

FIG. II-5: The electron microscopy image of one nanowire of transition metal oxides, taken by the field emission transmission electron microscope JEOL 2010 F, shows the polycrystalline structure and fine crystallites, growing perpendicularly to the direction of a fiber.

Figure 11:
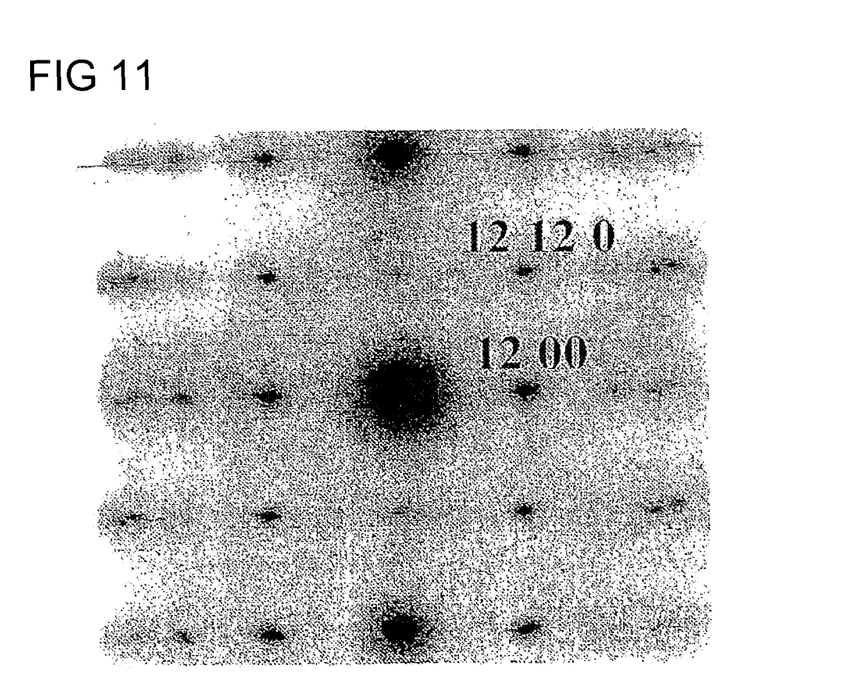
FIG. 11 is micrograph of a transmission electron diffraction (TED) image, taken in such a manner that the [001] axis in the crystal is parallel to the electron beam using a field emission transmission electron microscope (JEOL® 2010 F, JEOL Ltd. Tokyo, Japan), of the nanowire of transition metal oxides of FIG. 10 formed in Example II of this application demonstrating that the oxide phase formed is $Mo_5O_{14}$ according to aspect of embodiments and/or embodiments of the present invention.

FIG. II-6: Electron diffraction belonging to FIG. 5, demonstrating, that the oxide phase formed is $Mo_5O_{14}$. The image is taken in such a manner, that the [001] axis in the crystal is parallel to the electron beam.

Figure 12:
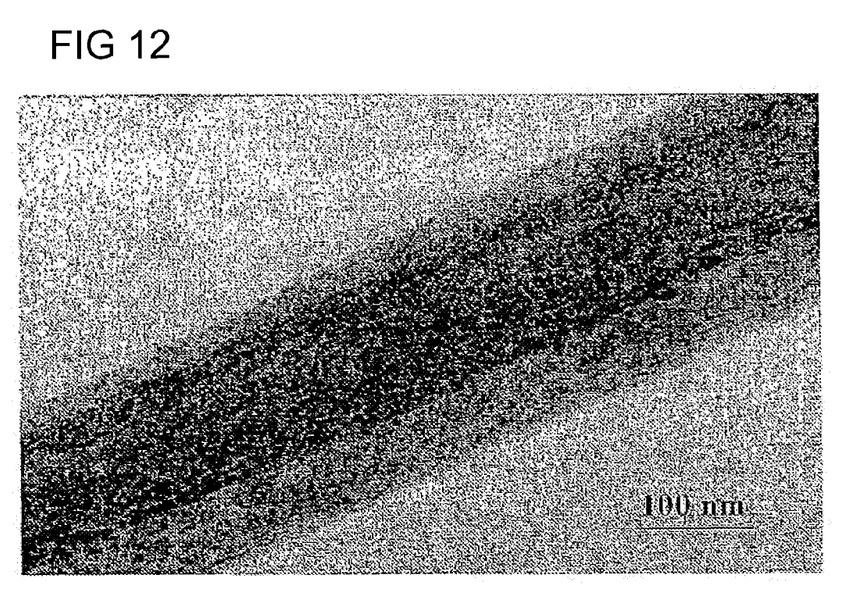
FIG. 12 is a micrograph of a transmission electron microscopy (TEM) image, taken using a field emission transmission electron microscope (JEOL® 2010 F, JEOL Ltd. Tokyo, Japan), of one nanowire of transition metal oxides formed in Example II of this application showing polycrystalline structure of one nanowire of transition metal oxides after sulphurization according to aspect of embodiments and/or embodiments of the present invention.

FIG. II-7: The electron microscopy image, taken by the field emission transmission electron microscope JEOL 2010 F, showing one nanowire of transition metal oxides after sulphurization. Polycrystalline structure is visible.

Figure 13:
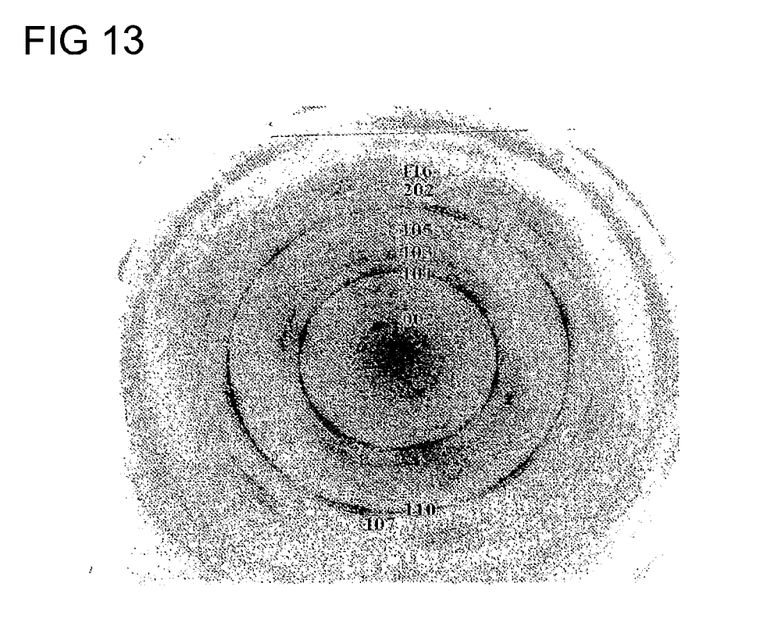
FIG. 13 is micrograph of a transmission electron diffraction (TED) image, taken using a field emission transmission electron microscope (JEOL® 2010 F, JEOL Ltd. Tokyo, Japan), one nanowire of transition metal oxides formed in Example II of FIG. 12 formed in Examples II of this application demonstrating, that the material is completely transformed into $MoS_2$ and, based on the variable intensity of individual rings, that crystallites formed $MoS_2$ are not completely randomly oriented: however, orientation order is partly present among them, according to aspect of embodiments and/or embodiments of the present invention.

FIG. II-8: Electron diffraction belonging to FIG. 7, demonstrating, that the material is completely transformed into $MoS_2$. From the variable intensity of individual rings it is evident, that the crystallites are not completely randomly oriented, however orientation order is partly present among them.

The above described technical problem is according to the invention solved by chemical transformation of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te), H is a halogen (I). The chemical transformation of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te), H is a halogen (I), is carried out in two steps, actually first in the step of heating in the presence of oxygen, whereby transformation of nanowires into quasi one-dimensional metal oxides of transition metals takes place, followed by the sulphurization process. The starting material in the form of quasi one-dimensional materials, consisting of nanowires with a diameter of under one micrometer, described by the formula $M_6C_yH_z$, $8.2<y+z\leq10$, is first heated in the air, or in the presence of oxygen, at temperatures above 200° C. and below 2000° C., as it is shown in FIG. 6. One-dimensional structures of metal oxides of transition metals are formed thereby.

Chemical transformation, sulphurization of metal oxides of transition metals, formed from quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te); H is a halogen (I), is carried out under conditions, in which the reactive reagent, containing a chalcogen, exists in vapor phase. The sulphurization of transition metal oxides occurs in a quartz tube with gas 1, containing 98 volume percent of argon as a carrier gas, 1 volume percent of $H_2S$ and 1 volume percent of $H_2$. The reaction occurs in one-zone oven as it is schematically shown in FIG. 7. The reactive reagent for the sulphurization $H_2S$ is thereby in vapor phase.

This transformation of quasi one-dimensional ternary materials, consisting of nanowires with a diameter of under one micrometer, according to the two-step process described, leads to the replacement of the iodine with a chalcogen (e.g., sulphur) and to the transformation into quasi one-dimensional structures of transition metal dichalcogenides, consisting of fine crystallites of transition metal dichalcogenides.

The process for the synthesis of quasi one-dimensional structures of transition metal dichalcogenides, according to this invention, is therefore characterized in that the synthesis occurs by means of chemical transformation of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te), H is a halogen (I). The chemical transformation of metal oxides of transition metals formed of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te), H is a halogen (I), is carried out under conditions, in which the reactive reagent, containing a chalcogen, is present in vapor phase. Quasi one-dimensional material consisting of nanowires is, according to this invention, first heated in the air or in the presence of oxygen, at temperatures higher than 200° C. in such a manner, that it is transformed into an oxide, which preserves, however, the basic form of nanowires. This is followed by sulphurization and nanowires of transition metal dichalcogenides are formed, which consist, however, of fine crystallites. So this concerns a synthetic process for preparing oxides from basic nanowires and a synthetic process for preparing nanowires of transition metal dichalcogenides, consisting of crystallites of transition metals, from basic nanowires with a diameter of under one micrometer, described by the formula $M_6C_yH_z$, $8.2<y+z\leq10$, where M is a transition metal (Mo, W, Ta, Nb), C is a chalcogen (S, Se, Te); H is a halogen (I), through oxides. The morphology of the material of transition metal dichalcogenides, obtained by the process according to the invention, is characterized in that they have the configuration of quasi one-dimensional transition metal dichalcogenides (nanowires, microwires and ribbons of transition metal dichalcogenides), consisting of fine crystallites of transition metal dichalcogenides.

Experiments II

The example of application describes the synthesis of quasi one-dimensional structure of transition metal dichalcogenides by the chemical transformation of quasi one-dimensional materials, consisting of nanowires with a diameter of under one micrometer, described by the formula $M_6C_yH_z$, $8.2<y+z\leq10$, where M is a transition metal (Mo, W, Ta, Nb), C is a chalcogen (S, Se, Te), H is a halogen (I).

Into a quartz boat, 50 mg of $Mo_6S_2I_8$ nanowires were introduced, which had been synthesized directly from the elements, as described in Patent Application EP 1 541 528.

The boat with a material composed of bundles of $Mo_6S_2I_8$ nanowires was placed into a quartz tube with a length of 1000 mm and a diameter of 32 mm in an one-zone oven, heated to 380° C., and the material was heated in the air for two hours. A trap, cooled with water, was placed at one side of the quartz tube. The trap served for collecting the iodine released and simultaneously enabled the access of the air to the material in the boat. The schematic course of heating is shown in FIG. 6. The weight of the material formed, consisting of quasi one-dimensional structures of metal oxides of transition metals (nanowires, microwires and ribbons), was 27 mg.

The boat with quasi one-dimensional transition metal oxides formed was placed into a quartz tube with a diameter of 34 mm, a wall thickness of 2 mm and a length of 1000 mm, closed at one end, and fitted with rough surface at the other end, enabling the closure of the tube after the introduction of the boat with the material and a simultaneous inlet of the gas into the quartz tube. The quartz tube also had a quartz outlet for the outlet of gases as shown in FIG. 7.

The closed quartz tube was first purged with argon gas for 20 minutes and then it was continued with blowing with Gas 1 composed of 98% of argon, 1% of $H_2S$ and 1% of $H_2$ for 15 minutes. The Gas 1 flow-rate was 30 cm³ per minute. The quartz tube was carefully introduced into the heated one-zone oven. The temperature of the site where the boat was placed was 860° C., as measured by a thermocouple. After two hours of blowing with Gas 1 at this temperature, the quartz tube was taken out of the zone-oven and left at room temperature for half an hour to cool down. During the whole process, blowing with Gas 1 was continued. After half an hour, when the quartz tube was cooled to the temperature below 50° C., Gas 1 was turned off and the boat with the material formed was taken out of the quartz tube. The weight of the material formed was 30 mg.

The phases formed by oxidation and sulphurization were examined with scanning electron microscopy (SEM)—FIG. 8, transmission electron microscopy (TEM)—FIGS. 9, 10, 12 and electron diffraction (TED)—FIGS. 11, 13.

The invention claimed is:

1. A process for the synthesis of any one of nanotubes of a transition metal dichalcogenide, fullerene-like nanostructures of a transition metal dichalcogenide, and nanotubes of a transition metal dichalcogenide, filled with fullerene-like nanostructures of a transition metal dichalcogenide, the process comprising exposing a quasi one-dimensional material to at least one reagent comprising a chalcogen to chemically transform the quasi one-dimensional material having a diameter less than about one micrometer, the material having a formula $M_6C_yH_z$, $8.2<y+z\leq10$, where M comprises a transition metal selected from Mo, W, Ta, and Nb, C comprises a chalcogen selected from S, Se, and Te, and H comprises a halogen comprising I.

2. The process according to claim 1, wherein the chemical transformation of the quasi one-dimensional material having the formula $M_6C_yH_z$, $8.2<y+z\leq10$, where M comprises a transition metal selected from Mo, W, Ta, and Nb, C comprises a chalcogen selected from S, Se, and Te, and H comprises a halogen comprising I, is carried out in the presence of at least one reactive reagent containing a chalcogen.

3. The process according to claim 1, wherein the chemical transformation of the quasi one-dimensional material having the formula $M_6C_yH_z$, $8.2<y+z\leq10$, where M comprises a transition metal selected from Mo, W, Ta, and Nb, C comprises a chalcogen selected from S, Se, and Te, and H comprises a halogen comprising I, is carried out under conditions in which the reagent comprises a reactive reagent containing a chalcogen comprises in vapor phase.

4. A process for the synthesis of a quasi one-dimensional structure comprising a metal oxide comprising a transition metal having a quasi one-dimensional structure comprising a transition metal dichalcogenide or fine crystallites of a transition metal dichalcogenide, the process comprising a chemical reaction of a quasi one-dimensional material comprising a nanowire having a diameter less than about one micrometer, the material having a formula $M_6C_yH_z$, $8.2<y+z\leq10$, where M comprises a transition metal selected from Mo, W, Ta, and Nb, C comprises a chalcogen selected from S, Se, and Te, H comprises a halogen comprising I, whereby the said quasi one-dimensional material is first heated in the air or otherwise in the presence of oxygen, at an elevated temperature and transformed into a quasi one-dimensional metal oxide comprising a transition metal, the quasi one-dimensional metal oxide having a formula $MO_X$, $0.3<x\leq3$, where M comprises a transition metal selected from Mo, W, Ta, and Nb, and O comprises oxygen; and said quasi one-dimensional metal oxide is chemically transformed using a gas containing a reactive reagent containing a chalcogen, whereby the process occurs at an elevated temperature.

5. The process according to claim 4, wherein the quasi one-dimensional material is heated in the presence of oxygen at temperatures above 200° C. and below 1800° C.

6. The process according to claim 4, wherein the chemical transformation of the quasi one-dimensional metal oxide into the quasi one-dimensional transition metal dichalcogenide occurs with a gas containing a reactive reagent containing a chalcogen.

7. The process according to claim 4, wherein the chemical transformation occurs at an elevated temperature under conditions, in which the reactive reagent containing a chalcogen comprises a vapor phase.

8. The process according to claim 4, wherein the quasi one-dimensional material is heated in the presence of oxygen at temperatures above 300° C. and below 1800° C.

9. The process according to claim 4, wherein the chemical transformation of the quasi one-dimensional metal oxide into the quasi one-dimensional transition metal dichalcogenide occurs with a gas containing a reactive reagent and 98 volume percent of a carrier gas.

10. The process according to claim 4, wherein the chemical transformation of the quasi one-dimensional metal oxide into the quasi one-dimensional transition metal dichalcogenide occurs with a gas containing a reactive reagent and 98 volume percent of a carrier gas comprising argon.

11. The process according to claim 4, wherein the chemical transformation of the quasi one-dimensional metal oxide into the quasi one-dimensional transition metal dichalcogenide occurs with a gas containing a reactive reagent and one volume percent of $H_2$.

12. The process according to claim 4, wherein the chemical transformation of the quasi one-dimensional metal oxide into the quasi one-dimensional transition metal dichalcogenide occurs with a gas containing a reactive reagent and one volume percent of $H_2S$.

13. The process according to claim 4, wherein the chemical transformation occurs at an elevated temperature above 300° C. under conditions, in which the reactive reagent containing a chalcogen comprises a vapor phase.

14. A material comprising a transition metal dichalcogenide obtained by the process according to claim 1, wherein the material comprises a morphology comprising one or more fullerene-like nanostructures of a transition metal dichalcogenide inside one or more nanotubes of a transition metal dichalcogenide.

15. A material comprising a transition metal dichalcogenide obtained by the process according to claim 2, wherein the material comprises a morphology comprising one or more fullerene-like nanostructures of a transition metal dichalcogenide inside one or more nanotubes of a transition metal dichalcogenide.

16. A material comprising a transition metal dichalcogenide obtained by the process according to claim 3, wherein the material comprises a morphology comprising one or more fullerene-like nanostructures of a transition metal dichalcogenide inside one or more nanotubes of a transition metal dichalcogenide.

17. A process for a synthesis of a transition metal dichalcogenide comprising exposing a quasi one-dimensional material to at least one reagent comprising a chalcogen to transform the quasi one-dimensional material to any one of a nanotube of a transition metal dichalcogenide; a fullerene-like nanostructure of a transition metal dichalcogenide; or a fullerene-like nanostructure of a transition metal dichalcogenide within a nanotube of a transition metal dichalcogenide,
wherein the quasi one-dimensional material comprises:
 α. a diameter less than about one micrometer; and
 β. a formula comprising $M_6C_yH_z$, where:
  (i) M comprises one of Mo, W, Ta, Nb, or any combination thereof;
  (ii) C comprises one of S, Se, Te, or any combination thereof;
  (iii) H comprises a halogen comprising I; and
  (iv) a sum (y+z) comprises a sum in the range of about 8.2 to about 10.

18. The process according to claim 17, wherein the quasi one-dimensional material comprising the formula comprising $M_6C_yH_z$, where:
 (i) M comprises one of Mo, W, Ta, Nb, or any combination thereof;
 (ii) C comprises one of S, Se, Te, or any combination thereof;
 (iii) H comprises a halogen comprising I; and
 (iv) the sum (y+z) comprises a sum in the range of greater than about 8.2 to about 10,
is exposed at a sufficient temperature to the at least one reagent comprising the chalcogen to for a sufficient time to chemically transform the quasi one-dimensional material to any one of a nanotube of a transition metal dichalcogenide; a fullerene-like nanostructure of a transition metal dichalcogenide; or a fullerene-like nanostructure of a transition metal dichalcogenide within a nanotube of a transition metal dichalcogenide.

19. The process according to claim 17, wherein the at least one reagent comprising the chalcogen comprises a vapor phase.

20. A material comprising a transition metal dichalcogenide obtained by the process according to claim 17, wherein the material comprises a fullerene-like nanostructure of a transition metal dichalcogenide within a nanotube of a transition metal dichalcogenide.

21. A material comprising a transition metal dichalcogenide obtained by the process according to claim 18, wherein the material comprises a fullerene-like nanostructure of a transition metal dichalcogenide within a nanotube of a transition metal dichalcogenide.

22. A material comprising a transition metal dichalcogenide obtained by the process according to claim 19, wherein the material comprises a fullerene-like nanostructure of a transition metal dichalcogenide within a nanotube of a transition metal dichalcogenide.

23. A process for the synthesis of a quasi one-dimensional structure comprising:
 (a) exposing a quasi one-dimensional material comprising the nanowire, at an elevated temperature, to air or the presence of oxygen for a sufficient time to transform the quasi one-dimensional material comprising the nanowire to a quasi one-dimensional metal oxide; and
 (b) exposing the quasi one-dimensional metal oxide, at an elevated temperature, to a reagent comprising a chalcogen for a sufficient time to transform the quasi one-dimensional metal oxide comprising a transition metal to a quasi one-dimensional structure comprising a transition metal dichalcogenide or fine crystallites of a transition metal dichalcogenide,
wherein the quasi one-dimensional material comprising the nanowire comprises:
 α. a diameter less than about one micrometer; and
 β. a formula comprising $M_6C_yH_z$, where:
  (i) M comprises one of Mo, W, Ta, Nb, or any combination thereof;
  (ii) C comprises one of S, Se, Te, or any combination thereof;
  (iii) H comprises a halogen comprising I; and
  (iv) a sum (y+z) comprises a sum in the range of greater than about 8.2 to about 10 and
wherein the quasi one-dimensional metal oxide comprising a transition metal comprises a formula comprising $MO_x$, where:
 (i) M comprises one of Mo, W, Ta, or Nb, or any combination thereof;
 (ii) O comprises oxygen; and
 (iii) x comprises from greater than about 0.3 to about 3.

24. The process according to claim 23, wherein the quasi one-dimensional material comprising the nanowire is exposed to the presence of oxygen at the elevated temperature comprising from above about 200° C. and to below about 1800° C.

25. The process according to claim 23, wherein the transformation of the quasi one-dimensional metal oxide to the quasi one-dimensional transition metal dichalcogenide comprises a chemical transformation comprising exposing the quasi one-dimensional metal oxide to a gas comprising the reagent comprising the chalcogen.

26. The process according to claim 23, wherein the transformation of the quasi one-dimensional metal oxide to the quasi one-dimensional transition metal dichalcogenide comprises exposing the quasi one-dimensional metal oxide to a gas comprising a reagent comprising the chalcogen comprising a vapor phase.

27. The process according to claim 23, wherein the quasi one-dimensional material comprising the nanowire is exposed to the presence of oxygen at the elevated temperature comprising from above about 300° C. and to below about 1800° C.

28. The process according to claim 23, wherein the transformation of the quasi one-dimensional metal oxide into the quasi one-dimensional transition metal dichalcogenide comprises a chemical transformation comprising exposing the quasi one-dimensional metal oxide to a gas comprising the reagent and about 98 volume percent (vol %) of a carrier gas.

29. The process according to claim 23, wherein the transformation of the quasi one-dimensional metal oxide into the quasi one-dimensional transition metal dichalcogenide comprises a chemical transformation comprising exposing the quasi one-dimensional metal oxide to a gas comprising the reagent and about 98 volume percent (vol %) of a carrier gas comprising argon.

30. The process according to claim 23, wherein the transformation of the quasi one-dimensional metal oxide into the quasi one-dimensional transition metal dichalcogenide comprises a chemical transformation comprising exposing the quasi one-dimensional metal oxide to a gas comprising the reagent and a carrier gas comprising about one volume percent (vol %) $H_2$.

31. The process according to claim 23, wherein the transformation of the quasi one-dimensional metal oxide into the quasi one-dimensional transition metal dichalcogenide comprises a chemical transformation comprising exposing the quasi one-dimensional metal oxide to a gas comprising the reagent and a carrier gas comprising about one volume percent (vol %) $H_2S$.

32. The process according to claim 23, wherein the transformation of the quasi one-dimensional metal oxide into the quasi one-dimensional transition metal dichalcogenide comprises a chemical transformation comprising exposing the quasi one-dimensional metal oxide at a sufficiently elevated temperature comprising greater that about 300° C. such that the reagent comprising the chalcogen comprises a vapor phase.

* * * * *